(12) United States Patent
Kutney et al.

(10) Patent No.: US 11,150,120 B2
(45) Date of Patent: Oct. 19, 2021

(54) LOW TEMPERATURE THERMAL FLOW RATIO CONTROLLER

(71) Applicant: APPLIED MATERIALS, INC., Santa Clara, CA (US)

(72) Inventors: Michael Kutney, Santa Clara, CA (US); Ashley M. Okada, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 102 days.

(21) Appl. No.: 16/578,371

(22) Filed: Sep. 22, 2019

(65) Prior Publication Data

US 2021/0088367 A1   Mar. 25, 2021

(51) Int. Cl.
| | | |
|---|---|---|
| G01F 1/684 | (2006.01) | |
| G01F 1/74 | (2006.01) | |
| G01F 15/02 | (2006.01) | |
| G01F 1/698 | (2006.01) | |

(52) U.S. Cl.
CPC ............ *G01F 1/684* (2013.01); *G01F 1/698* (2013.01); *G01F 1/74* (2013.01); *G01F 15/02* (2013.01)

(58) Field of Classification Search
CPC . G01F 1/684; G01F 15/02; G01F 1/74; G01F 1/698
See application file for complete search history.

(56) References Cited

U.S. PATENT DOCUMENTS

| | | | | |
|---|---|---|---|---|
| 5,036,701 | A * | 8/1991 | van der Graaf | G01F 1/6847 73/204.12 |
| 5,683,548 | A * | 11/1997 | Hartig | C23C 16/507 438/729 |
| 5,804,717 | A * | 9/1998 | Lucas | G01F 5/00 73/202 |
| 5,868,159 | A | 2/1999 | Loan et al. | |
| 7,673,645 | B2 | 3/2010 | Ding et al. | |
| 8,650,946 | B1 * | 2/2014 | Feller | G01F 25/0007 73/204.23 |
| 8,751,180 | B2 | 6/2014 | Lull et al. | |
| 2006/0173642 | A1 * | 8/2006 | Shajii | G01F 25/0053 702/100 |
| 2013/0260537 | A1 | 10/2013 | Von Kanel | |
| 2018/0164137 | A1 * | 6/2018 | Layher | G01F 1/6842 |

(Continued)

OTHER PUBLICATIONS

International Search Report and Written Opinion for PCT/US2020/052001 dated Jan. 4, 2021.

*Primary Examiner* — Francis C Gray
(74) *Attorney, Agent, or Firm* — Moser Taboada

(57) ABSTRACT

Methods and apparatus for a flow ratio controller are provided herein. In some embodiments, a flow ratio controller includes an inlet; a plurality of channels extending from the inlet to a corresponding plurality of outlets; a bypass pipe extending from each channel of the plurality of channels that diverts a small portion of a flow from that channel and then returns the small portion of the flow back to that channel; and a thermal mass flow meter coupled to the bypass pipe having a first temperature sensor, a second temperature sensor, and a heating element disposed therebetween. A controller is configured to determine a flow rate through each of the plurality of channels based on a measured temperature difference between the first temperature sensor and the second temperature sensor.

17 Claims, 4 Drawing Sheets

(56) References Cited

U.S. PATENT DOCUMENTS

| | | |
|---|---|---|
| 2018/0174809 A1 | 6/2018 | Schuethe |
| 2019/0240432 A1* | 8/2019 | Burgess .................. G01F 1/698 |
| 2019/0243392 A1 | 8/2019 | Ding et al. |

* cited by examiner

LOW TEMPERATURE THERMAL FLOW RATIO CONTROLLER

FIELD

Embodiments of the present disclosure generally relate to substrate processing equipment and techniques.

BACKGROUND

Gas processing systems are often used in the semiconductor industry, for example, in processes such as chemical vapor deposition (CVD), high-density plasma chemical vapor deposition (HDPCVD), atomic layer deposition (ALD), etching, or the like. Systems, apparatus, and methods to distribute the flow of process gases into a process chamber in a desired ratio typically to process a substrate make use of mass flow controllers (MFC) that supply process gases to one or more flow ratio controllers (FRCs) to accurately control the desired flow distribution. However, the inventors have observed decomposition and corrosion of certain process gases in flow ratio controllers, which interferes with accurate flow measurement.

Accordingly, the inventors have provided improved methods and apparatus for distributing process gases to a process chamber.

SUMMARY

Embodiments of apparatus and methods for flow ratio controllers are provided herein. In some embodiments, a flow ratio controller, includes an inlet; a plurality of channels extending from the inlet to a corresponding plurality of outlets; a control valve in line with each channel of the plurality of channels; a bypass pipe extending from each channel of the plurality of channels that diverts a small portion of a flow from that channel and then returns the small portion of the flow back to that channel; a thermal mass flow meter coupled to the bypass pipe, the thermal mass flow meter including a first temperature sensor, a second temperature sensor, and a heating element disposed between the first temperature sensor and the second temperature sensor, wherein the heating element is configured to heat the flow through the bypass pipe to a predetermined temperature of about 40 degrees to about 60 degrees Celsius; and a controller to determine a flow rate through each of the plurality of channels based on a measured temperature difference between the first temperature sensor and the second temperature sensor and to control the control valve of each channel to provide a predetermined flow ratio of a process gas between the plurality of channels.

In some embodiments, an apparatus for controlling gas distribution to an etch chamber includes a gas source; an etch chamber having a chamber body and a plurality of gas delivery zones; at least one flow ratio controller, comprising an inlet coupled to the gas source; a plurality of channels from the inlet to a corresponding plurality of outlets, wherein the plurality of outlets are fluidly coupled to respective gas delivery zones of the etch chamber; a bypass pipe extending from each channel of the plurality of channels that diverts a small portion of a flow from that channel and then returns the small portion of the flow back to that channel; a thermal mass flow meter coupled to the bypass pipe, the thermal mass flow meter including a first temperature sensor, a second temperature sensor, and a heating element disposed between the first temperature sensor and the second temperature sensor, wherein the heating element is configured to heat the flow through the bypass pipe to a predetermined temperature; and a controller to provide a flow ratio of a process gas from the gas source between the plurality of outlets and to determine a flow rate through each of the plurality of outlets based on a measured temperature difference between the first temperature sensor and the second temperature sensor.

In some embodiments, a method of providing process gases to a process chamber includes flowing one or more process gases through a flow ratio controller to provide a first flow rate of the one or more process gases through a first channel to a first gas delivery zone in a process chamber, a second flow rate of the one or more process gases through a second channel to a second gas delivery zone in the process chamber, and a third flow rate of the one or more process gases through a third channel to a third gas delivery zone in the process chamber; diverting a small flow from each of the first, second, and third channels to a respective thermal mass flow meter having a heating element, a first temperature sensor disposed upstream of the heating element, and a second temperature sensor disposed downstream of the heating element; providing power to the heating element in each thermal mass flow meter to heat the heating element to a predetermined temperature that prevents corrosion of the one or more process gases; and using a controller to calculate a measured temperature difference between the first temperature sensor and the second temperature sensor of each thermal mass flow meter to determine the first flow rate, the second flow rate, and the third flow rate.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
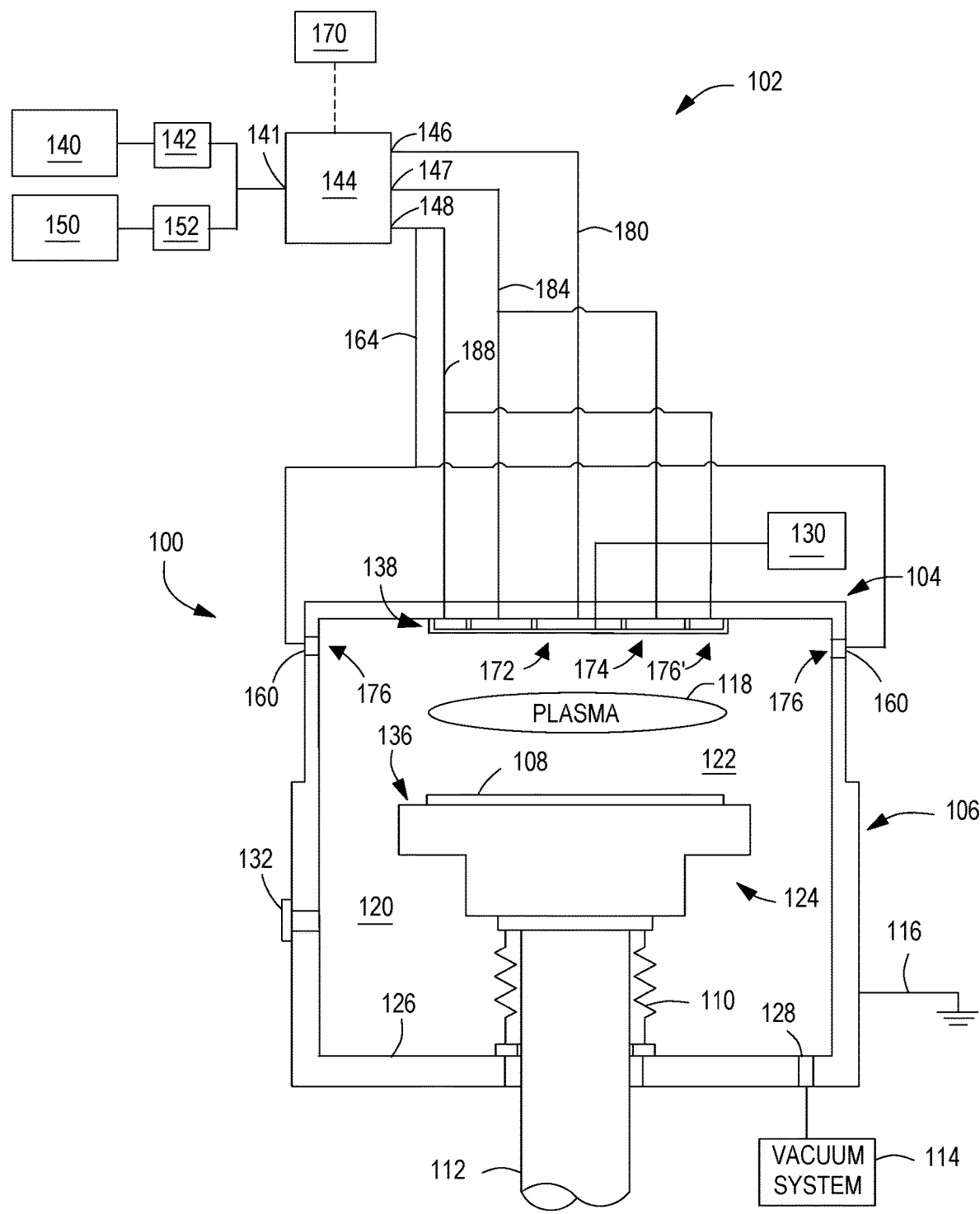
FIG. 1 is a schematic illustration of a flow distribution system in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of apparatus and methods for controlling gas distribution to multiple gas delivery zones in an etch chamber are provided herein. In some embodiments, the apparatus includes one or more flow ratio controllers for dividing a single mass flow into multiple flow lines, or channels. Aggressive etch chemistry using certain process gases leads to corrosion in gas distribution lines. In some embodiments, process gases include one or more of hydrogen bromine (HBr), chlorine ($Cl_2$), nitrogen trifluoride ($NF_3$), tetrafluoromethane ($CF_4$), silicon tetrachloride ($SiCl_4$), argon (Ar), oxygen ($O_2$), nitrogen ($N_2$), and helium (He). Corrosion may be exacerbated when the one or more flow ratio controllers includes a thermal mass flow meter having a heater. The heat provided by the heater may be advantageously lowered to reduce corrosion in the one or more flow ratio controllers.

FIG. 1 is a schematic illustration of a flow distribution system 102 coupled to a process chamber 100 in accordance with some embodiments of the present disclosure. In some embodiments, the process chamber 100 is an etching chamber. However, other types of processing chambers can also be used or be modified for use with embodiments of the flow distribution system 102 described herein. The process chamber 100 is a vacuum chamber which is suitably adapted to maintain sub-atmospheric pressures within an interior volume 120 of the process chamber 100 during substrate processing, such as for example high temperature and/or high power substrate processing. The process chamber 100 includes a chamber body 106 covered by a lid 104 which encloses a processing volume 122 located in an upper portion of the interior volume 120. The chamber body 106 and lid 104 may be made of metal, such as aluminum. The chamber body 106 may be grounded via a coupling to ground 116. The lid 104 can be electrically floated or grounded.

A substrate support 124 is disposed within the interior volume 120 to support and retain a substrate 108, such as a semiconductor substrate, for example, or other such substrate that may be electrostatically retained. The substrate support 124 may generally comprise a pedestal 136 and a support shaft 112 for supporting the pedestal 136. The support shaft 112 may be hollow and provides a conduit to provide, for example, process gases, gases, coolants, power, or the like, to the pedestal 136.

In some embodiments, a bellows 110 is disposed about the support shaft 112 and is coupled between the pedestal 136 and a bottom surface 126 of the process chamber 100 to provide a flexible seal that allows vertical motion of the pedestal 136 while preventing loss of vacuum from within the process chamber 100. Alternatively or in combination, a bellows (not shown) can be disposed about the support shaft 112 and can be coupled between a portion of the support shaft 112 disposed outside of the process chamber 100 and an exterior bottom surface of the process chamber 100 to provide a flexible seal that allows vertical motion of the pedestal 136 while preventing loss of vacuum from within the process chamber 100.

The process chamber 100 is coupled to and in fluid communication with a vacuum system 114, for example via an exhaust port 128 in the process chamber. The vacuum system 114 includes a throttle valve and vacuum pump, which are used to exhaust the process chamber 100. The pressure inside the process chamber 100 may be regulated at least in part by adjusting the throttle valve and/or vacuum pump. In some embodiments, the vacuum system 114 is disposed on one side of the process chamber 100. In some embodiments, the vacuum system 114 is centrally located below the process chamber 100. In some embodiments, the vacuum pump of the vacuum system 114 is a turbopump disposed below the process chamber 100 and configured to symmetrical evacuate the interior volume 120.

In operation, the substrate 108 may enter the process chamber 100 via a selectively sealable opening in the chamber body 106, for example, a slit valve 132. The opening may be selectively sealed via a door of the slit valve 132, or other apparatus for selectively providing access to the interior of the process chamber 100 through the opening. Further, in operation, a plasma 118 may be created in the interior volume 120 to perform one or more processes. The plasma 118 may be created by coupling power from a plasma power source (e.g., RF plasma power supply 130) to one or more process gases proximate to or within the interior volume 120 to ignite the process gases to create the plasma 118.

A plurality of process gases may be introduced into the interior volume 120 in a plurality of gas delivery zones. In some embodiments, the plurality of gas delivery zone is three gas delivery zones. In some embodiments, for example, the plurality of gas delivery zones correspond to regions on the substrate 108, such as for example, a central region, an annular middle region surrounding the central region, and an annular edge position surrounding the annular middle region. The plurality of process gases may be introduced into the interior volume 120 in any suitable manner such as by one or more of gas inlets, nozzles, showerheads, or the like. In some embodiments, the plurality of process gases are introduced into the interior volume 120 via a showerhead 138 installed in an upper region of the process chamber 100, such as in or on the lid 104, opposite the pedestal 136. In some embodiments, the plurality of process gases are introduced into the interior volume 120 through the sidewalls of the chamber body 106. In some embodiments, the plurality of process gases are introduced into the interior volume 120 via the showerhead 138 and through the sidewalls of the chamber body 106.

In some embodiments, at least some of the plurality of gas delivery zones are defined within the showerhead 138. For example, in some embodiments, the showerhead includes a first gas delivery zone 172 and a second gas delivery zone 174. In some embodiments, a central region of the showerhead 138 corresponds with the first gas delivery zone 172. In some embodiments, a peripheral region of the showerhead 138 corresponds with the second gas delivery zone 174. In some embodiments, a plurality of openings 160, or nozzles, disposed on or through the sidewall of the chamber body 106 define a third gas delivery zone 176. The showerhead 138 is coupled to and in fluid communication with the flow distribution system 102 to provide a plurality of process gases, via the showerhead 138, to the process chamber 100 for processing a substrate disposed therein. The plurality of openings 160 are coupled to and in fluid communication with the flow distribution system 102, 202 to provide process gases, via the plurality of openings 160, to the process chamber 100 for processing a substrate disposed therein.

In some embodiments, all of the plurality of gas delivery zones are defined within the showerhead 138. For example, the showerhead can include a first gas delivery zone 172, a second gas delivery zone 174, and, alternatively to the third gas delivery zone 176 defined by the plurality of openings 160, a third gas delivery zone 176'. In some embodiments, an edge region of the showerhead 138 corresponds with the third gas delivery zone 176'.

As shown in FIG. 1, the flow distribution system 102 controls a gas flow and composition to each of the first gas delivery zone 172, the second gas delivery zone 174, and the third gas delivery zone 176, 176'. In some embodiments, the gas flow can include gas flow or gas droplets entrained in a gas flow. In some embodiments, the flow distribution system 102 may be expanded in accordance with the principles disclosed herein to provide gas flow to additional gas delivery zones. In some embodiments, as shown in FIG. 1, the flow distribution system 102 includes a first flow ratio controller 144 having an inlet 141, and a plurality of outlets. In some embodiments, the inlet 141 is coupled to a gas source to provide one or more process gases or gaseous mixtures to the first flow ratio controller 144.

In some embodiments, the gas source includes a first gas source 140 through a first mass flow controller (MFC) 142. The first MFC 142 is configured to control the total flow rate of a first process gas provided to the first flow ratio controller 144. In some embodiments, the gas source includes a second gas source 150 through a second mass flow controller (MFC) 152. The second MFC 152 is configured to control the total flow rate of a second process gas provided to the first flow ratio controller 144. In some embodiments, the first gas source 140 includes hydrogen bromine (HBr) and the second gas source 150 includes at least one of chlorine ($Cl_2$), hydrogen bromine (HBr), nitrogen trifluoride ($NF_3$), tetrafluoromethane ($CF_4$), and silicon tetrachloride ($SiCl_4$). In some embodiments, the first gas source 140 includes chlorine ($Cl_2$) and the second gas source 150 includes hydrogen bromine (HBr). In some embodiments, the first process gas and the second process gas are mixed upstream from the first flow ratio controller 144.

In some embodiments, each outlet of the first flow ratio controller 144 is coupled to different gas delivery zones. In some embodiments, the plurality of outlets includes three outlets, for example, a first outlet 146, a second outlet 148, and a third outlet 158. In some embodiments, the plurality of outlets includes only two outlets, e.g., the first outlet 146 and the second outlet 148. The first outlet 146 is fluidly coupled to the first gas delivery zone 172 via a first gas line 180. The second outlet 148 is fluidly coupled to the second gas delivery zone 174 via a second gas line 184. In some embodiments, the third outlet 158 is fluidly coupled to the third gas delivery zone 176' via a third gas line 188. In some embodiments, the third outlet 158 is fluidly coupled to the third gas delivery zone 176 through a plurality of openings 160 or nozzles disposed through the sidewalls of the chamber body 106 via gas line 164.

Figure 2:
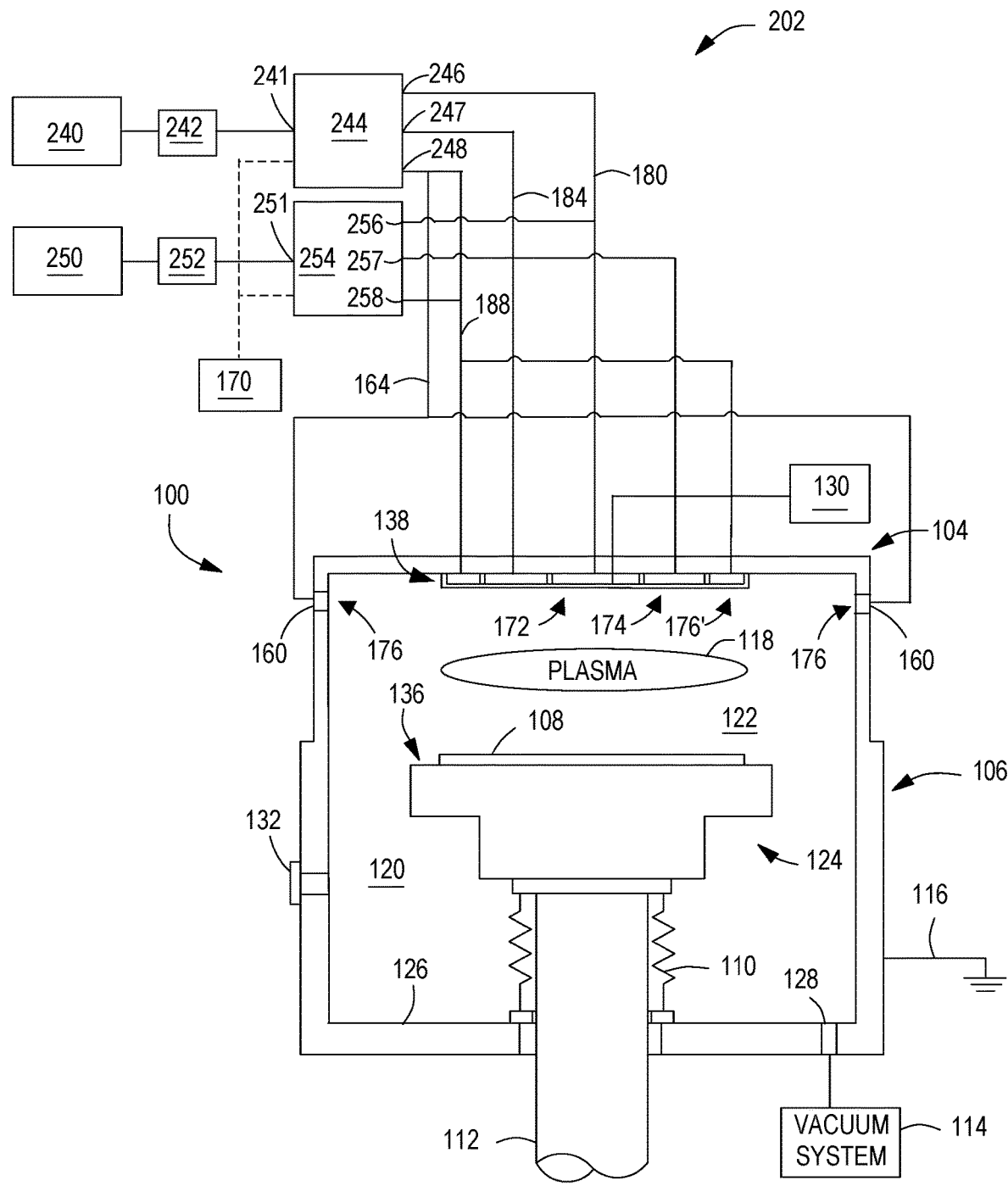
FIG. 2 is a schematic illustration of a flow distribution system in accordance with some embodiments of the present disclosure.

FIG. 2 is a schematic illustration of a flow distribution system 202 in accordance with some embodiments of the present disclosure. In some embodiments, the flow distribution system 202 includes a first flow ratio controller 244 and a second flow ratio controller 254. The first flow ratio controller 244 includes a first inlet 241, and a plurality of outlets. In some embodiments, the plurality of outlets includes a first outlet 246, a second outlet 247, and a third outlet 248. The first inlet 241 is coupled to a first gas source 240 that provides a first process gas (e.g., one or more process gases or gaseous mixtures) to the first flow ratio controller 244. In some embodiments, the first inlet 241 is fluidly coupled to the first gas source 240 through a first MFC 242. The first MFC 242 is configured to control the total flow rate of the first process gas provided to the first flow ratio controller 244.

The second flow ratio controller 254 includes a second inlet 251, and a plurality of outlets. In some embodiments, the plurality of outlets includes a first outlet 256, a second outlet 257, and a third outlet 258. The second inlet 251 is coupled to a second gas source 250 that provides a second process gas (e.g., one or more process gases or gaseous mixtures) to the second flow ratio controller 254. In some embodiments, the second inlet 251 is fluidly coupled to the second gas source 250 through a second MFC 252. The second MFC 252 is configured to control the total flow rate of the second process gas provided to the second flow ratio controller 254. In some embodiments, the first process gas and the second process gas are mixed downstream from the first flow ratio controller 244 and the second flow ratio controller 254 and upstream from the process chamber 100 to advantageously keep the first process gas and the second process gas separated as much as possible until entry into the process chamber 100.

In some embodiments, each outlet of the first and second flow ratio controllers 244, 254 is coupled to a different gas delivery zone. For example, in some embodiments, the first outlet 246 and the first outlet 256 are both coupled to the first gas delivery zone 172 via the first gas line 180. In some embodiments, the second outlet 247 and the second outlet 257 are fluidly coupled to the second gas delivery zone 174 via the second gas line 184. In some embodiments, the third outlet 248 and the third outlet 258 are fluidly coupled to the third gas delivery zone 176 via the third gas line 188. In some embodiments, the third outlet 248 and the third outlet 258 are fluidly coupled to the plurality of openings 160 via gas line 164.

In some embodiments, as shown in FIG. 1, the first flow ratio controller 144 is coupled to the controller 170. In some embodiments, as shown in FIG. 2, the first flow ratio controller 244 and the second flow ratio controller 254 are coupled to the controller 170. The controller 170 facilitates user selection and control of a predetermined flow ratio for each of the flow ratio controllers 144, 244, 254. The controller 170 facilitates control of the first, the second, and the third flow ratio controllers 144, 244, 254 to distribute flow of process gases according to the predetermined flow ratio. The controller 170 may provide for the control of the flow distribution system using pre-determined process recipes selected by a user or as part of a fabrication sequence. Alternatively or in combination, the controller 170 may provide for control of the flow division via manual entry of the desired flow rates, flow ratios, valve settings, or the like. Control of the predetermined flow ratio for each of the flow ratio controllers 144, 244, 254 advantageously provides for control of the flow rate and composition of process gases provided to the gas delivery zones within the process chamber 100, such as the first gas delivery zone 172, the second gas delivery zone 174, the third gas delivery zone 176, and the plurality of openings 160.

The controller 170 may include a central processing unit (CPU), a memory, and support circuits. The CPU may be any form of a general-purpose computer processor used in an industrial setting. Software routines can be stored in the memory, such as random access memory, read only memory, floppy or hard disk, or other form of digital storage. The support circuits are conventionally coupled to the CPU and may comprise cache, clock circuits, input/output sub-systems, power supplies, and the like. The software routines, when executed, transform the general purpose computer processor into a specific purpose computer (controller 170) that controls the chamber operation such that the methods disclosed herein are performed.

The configuration of the flow distribution system 102 and the flow distribution system 202 may be determined based upon the anticipated operating conditions and output requirements for a particular application. For example, in some embodiments, each of the flow ratio controllers 144, 244, 254 may provide flow ratios between 1:1 and 6:1 in half ratio increments (i.e., 1/1, 1.5/1, 2/1, 2.5/1 . . . 6/1) and be fully reversible (i.e., 1/1, 1/1.5, 2/1, 2.5/1 . . . 1/6) between the first gas delivery zone 172, the second gas delivery zone 174, and the third gas delivery zone 176, 176'. In some embodiments, the accuracy of the gas flow split may be within 5 percent, for example, to match the performance of existing equipment.

Figure 3:
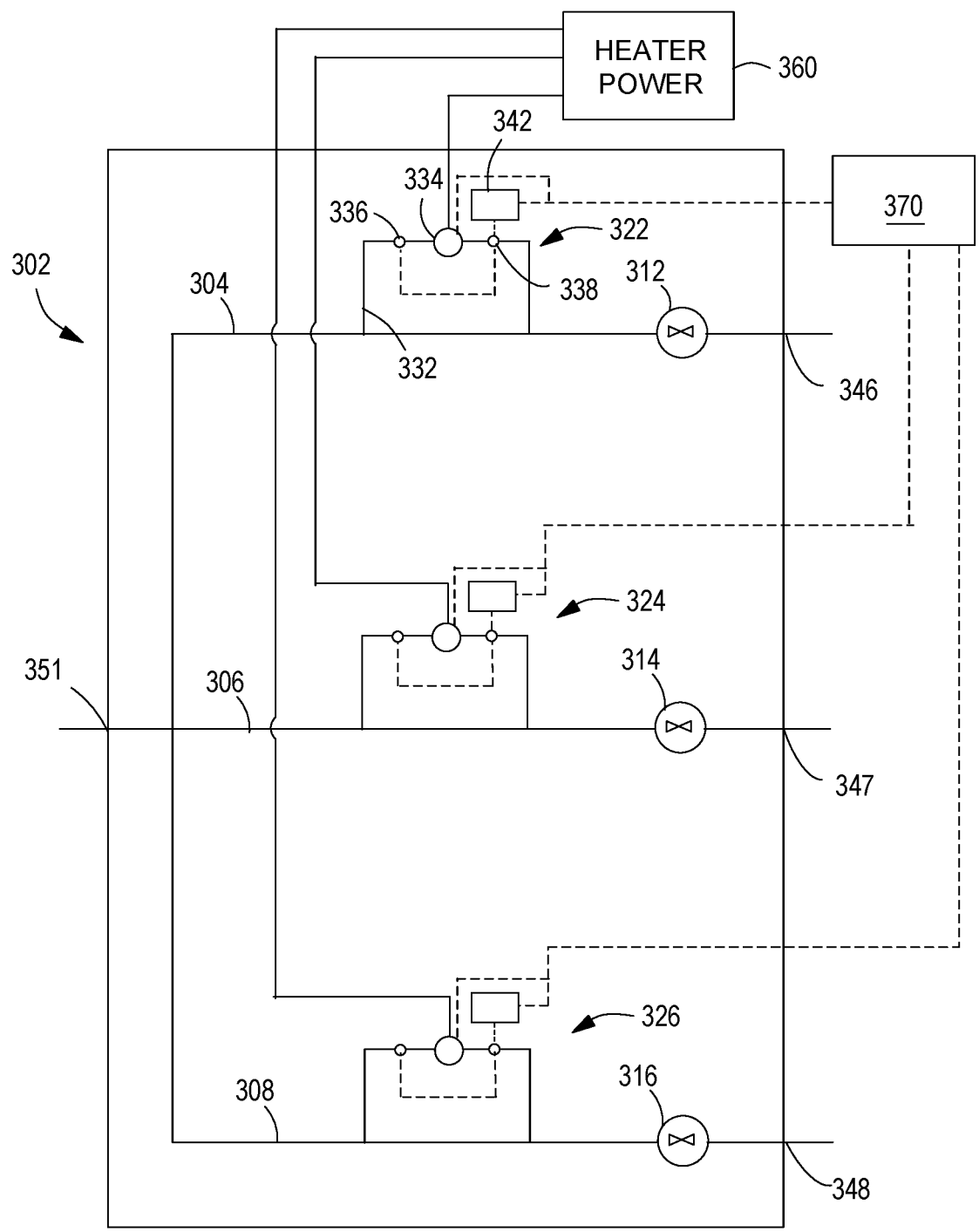
FIG. 3 is a schematic illustration of a flow ratio controller in accordance with some embodiments of the present disclosure.

FIG. 3 is a schematic illustration of a flow ratio controller 302 in accordance with some embodiments of the present disclosure. The flow ratio controller 302 may one or more of the flow ratio controllers 144, 244, 254 discussed above. The flow ratio controller 302 is configured to provide a flow ratio of a first process gas or process gas mixture between an inlet 351 and one or more outlets. In some embodiments, the flow ratio controller 302 includes a first outlet 346, a second outlet 347, and a third outlet 348. The first outlet 346 is fluidly coupled to a first gas delivery zone via a gas line (e.g., first gas line 180). The second outlet 347 is fluidly coupled to a second gas delivery zone via a gas line (e.g., second gas line 184). The third outlet 348 is fluidly coupled to a third gas delivery zone via a gas line (e.g., third gas line 188 or gas line 164). However, the flow ratio controller 302 may include more or less outlets fluidly coupled to a corresponding number of gas delivery zones.

The flow ratio controllers 144, 244, 254 include a plurality of channels corresponding with the plurality of outlets. In some embodiments, the plurality of channels is two channels, three channels, or four channels. For example, as shown in FIG. 3, the flow ratio controller 302 includes a first channel 304 from the inlet 351 to the first outlet 346, a second channel 306 from the inlet 351 to the second outlet 347, and a third channel 308 from the inlet 351 to the third outlet 348. A first control valve 312 is disposed in line with the first channel 304 to control a rate of gas flow through the first outlet 346. A second control valve 314 is disposed in line with the second channel 306 to control a rate of gas flow through the second outlet 347. A third control valve 316 is disposed in line with the third channel 308 to control a rate of gas flow through the third outlet 348. The first control valve 312, the second control valve 314, and the third control valve 316 may be any suitable valve for use in a semiconductor fabrication environment. The first control valve 312, the second control valve 314, and the third control valve 316 may be coupled to a controller 370. The controller 370 facilitates user selection and control of a predetermined flow ratio between the first channel 304, the second channel 306, and the third channel 308 of the flow ratio controller 302. In some embodiments, the controller 370 is similar to controller 170.

Each channel 304, 306, 308 of the flow ratio controller 302 includes a thermal mass flow meter to regulate a gas flow through each channel 304, 306, 308. For example, the first channel 304 includes a first thermal mass flow meter 322, the second channel 306 includes a second thermal mass flow meter 324, and the third channel 308 includes a third thermal mass flow meter 326. The following discussion regarding the first channel 304 and the first thermal mass flow meter 322 may be applied to the second channel 306 and the second thermal mass flow meter 324 and the third channel 308 and the third mass flow meter 326, respectively.

In some embodiments, first channel 304 includes a bypass pipe 332 that diverts a small portion of the flow from the first channel 304 and then returns the small portion of the flow back to the first channel 304. In some embodiments, the bypass pipe 332 is disposed upstream of the first control valve 312. The first thermal mass flow meter 322 is coupled to the bypass pipe 332. The bypass pipe 332 is sized to operate in a laminar flow regime over a full operating range of the flow ratio controller 302. In some embodiments, the thermal mass flow meter 322 includes a first temperature sensor 336, a second temperature sensor 338, and a heating element 334 disposed between the first temperature sensor 336 and the second temperature sensor 338. In some embodiments, the first temperature sensor 336 and the second temperature sensor 338 are disposed substantially equidistant from the heating element 334.

The first temperature sensor 336 is configured to measure a first temperature T1 of the process gas upstream of the heating element 334. The second temperature sensor 338 is configured to measure a second temperature T2 of the process gas downstream of the heating element 334. In some embodiments, the first and second temperature sensors 336, 338 are resistance temperature detectors (RTDs).

In use, a heater power supply 360 heats the heating element 334 to a predetermined temperature. When there is no flow through the bypass pipe 332, the first temperature sensor 336 and the second temperature sensor 338 measure a substantially similar temperature. In other words, a measured temperature difference between T2 and T1 is substantially zero. In some embodiments, the heating element 334 can protrude into a gas stream of the bypass pipe 332. In such embodiments, as process gas flows through the bypass pipe 332 and passes over the heating element 334, the process gas is heated. In some embodiments, the heating element 334 is external to the bypass pipe 332, for example, wrapped around the bypass pipe 332. In such embodiments, the heating element 334 heats up a portion of the bypass pipe 332 and as process gas flows through the bypass pipe 332, the process gas is heated. The gas molecules of the process gas carry the heat downstream causing the second temperature T2 to increase with respect to the first temperature T1. The thermal mass flow meter 322 includes a Wheatstone bridge circuit 342 connected to terminals of the first temperature sensor 336 and the second temperature sensor 338. The Wheatstone bridge circuit 342 is configured to convert the measured temperature difference into a voltage difference that is calibrated against known flow rates.

A small diameter of the bypass pipe 332 advantageously minimizes electric power consumption by the heating element 334. However, the heat provided by the heating element 334 also heats a bypass pipe wall, which can increase the corrosion rate of certain gases flowing through the bypass pipe 332 and cause drift of the first and second temperature sensors 336, 338. Drift of the first and second temperature sensors 336, 338 leads to inaccurate temperature measurement readings. The predetermined temperature can be advantageously lowered to reduce heating of the bypass pipe wall and as a result decrease the corrosion rate. The flow ratio controller 302 can be calibrated with the lower predetermined temperature. In some embodiments, the predetermined temperature is lowered from about 70 to about 90 degrees Celsius to about 40 to about 60 degrees Celsius. In some embodiments, the predetermined temperature is about 45 degrees to about 55 degrees Celsius.

In some embodiments, the first thermal mass flow meter 322, the second thermal mass flow meter 324, and the third thermal mass flow meter 326 are coupled to the controller 370. The controller 370 is configured to take readings from the temperature sensors of each of the thermal mass flow meters 322, 324, 326 to control a flow rate through each of the outlets 346, 347, 348. In some embodiments, the controller 370 is also coupled to the heater power supply 360 to control an amount of heat provided to the heating element in each of the thermal mass flow meters 322, 324, 326. The heater power supply 360 may be one power supply that provides heat to the heating element in each of the thermal mass flow meters 322, 324, 326.

Figure 4:
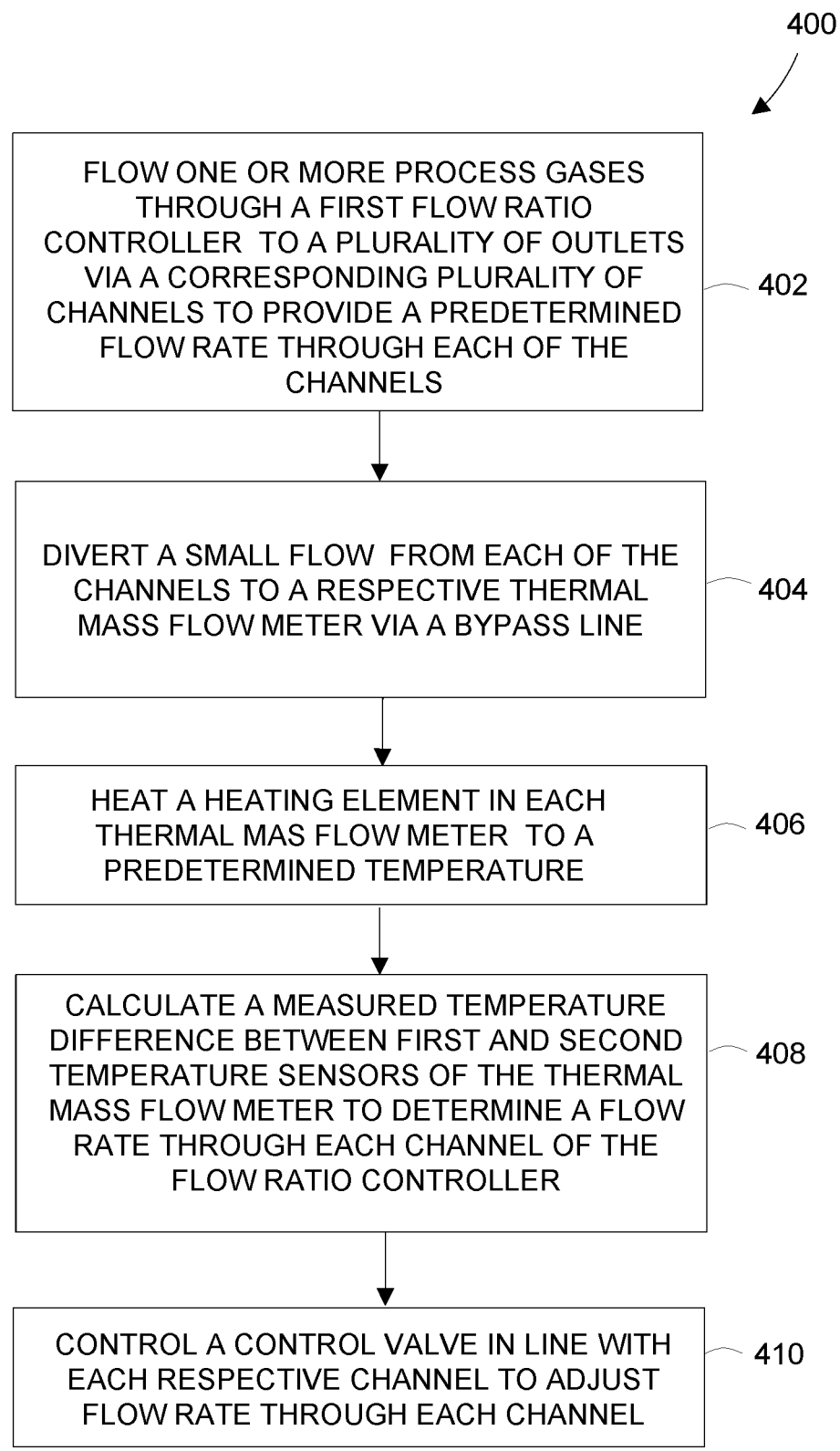
FIG. 4 is a flow chart of a method of distributing process gases to multiple gas delivery zones in accordance with some embodiments of the present disclosure.

FIG. 4 is a flow chart of a method 400 of distributing process gas to multiple gas delivery zones in accordance with some embodiments of the present disclosure. In some embodiments, the flow distribution systems 102, 202 described above may be used to perform the method 400. In some embodiments, the method 400 for controlling gas distribution to multiple gas delivery zones, at 402, includes flowing one or more process gases through a first flow ratio controller (e.g., first flow ratio controller 144, 244, flow ratio controller 302) to a plurality of outlets via a corresponding plurality of channels to provide a predetermined flow rate of the one or more process gases through each of the channels to a corresponding number of gas delivery zones in a process chamber. For example, a first flow rate of the one or more process gases flows through a first channel (e.g., first channel 304) to a first gas delivery zone (e.g., first gas delivery zone 172) in the process chamber (e.g., process chamber 100), a second flow rate of the one or more process gases flows through a second channel (e.g., second channel 306) to a second gas delivery zone (e.g., second gas delivery zone 174) in the process chamber, and a third flow rate of the one or more process gases flows through a third channel (e.g., third channel 308) to a third gas delivery zone (e.g., third gas delivery zone 176, plurality of openings 160) in the process chamber. In some embodiments, the one or more process gases comprises at least one hydrogen bromine (HBr) or chlorine ($Cl_2$), such as discussed above with respect to the first gas source 140 and the second gas source 150. In some embodiments, the first flow ratio controller is fluidly coupled to a first gas source, such as the first gas source 140 and a second gas source, such as the second gas source 150. In some embodiments, the first flow ratio controller is fluidly coupled to a first gas source, such as the first gas source 240 and a second flow ratio controller (e.g., second flow ratio controller 254) is fluidly coupled to a second gas source, such as the second gas source 250.

At 404, a small flow is diverted from each of the first, second, and third channels to a respective thermal mass flow meter (e.g., thermal mass flow meters 322, 324, 326) via a bypass line or pipe (e.g., bypass pipe 332). At 406, a heating element in each thermal mass flow meter 322, 324, 326 is provided with power to heat the heating element to a predetermined temperature. The predetermined temperature is lowered to reduce or prevent corrosion of the one or more process gases in the bypass line. For example, in some embodiments, the predetermined temperature is lowered to about 40 to about 60 degrees Celsius. In some embodiments, the predetermined temperature is about 45 degrees to about 55 degrees Celsius. A first temperature sensor is disposed upstream of the heating element and a second temperature sensor is disposed downstream of the heating element.

At 408, a controller (e.g., controller 170, 370) calculates a measured temperature difference between the first and second temperature sensors. The controller is configured to determine a flow rate through each channel based on the measured temperature difference. For example, a Wheatstone bridge circuit (e.g., Wheatstone bridge circuit 342) is configured to convert the measured temperature difference into a voltage difference that is calibrated against known flow rates to determine a flow rate through each channel of the flow ratio controller. In some embodiments, during use, the controller is configured to maintain a temperature of each of the bypass pipes at or near the predetermined temperature by controlling the power provided to each heating element.

At 410, the controller controls a control valve in line with each respective channel of the flow ratio controller by sending an electric signal to the control valve to open or close the valve to adjust a flow rate through each channel to provide a desired quantity of process gas to each respective outlet of the flow ratio controller.

While the foregoing is directed to embodiments of the present disclosure, other and further embodiments of the disclosure may be devised without departing from the basic scope thereof.

The invention claimed is:

1. A flow ratio controller, comprising
an inlet;
a plurality of channels extending from the inlet to a corresponding plurality of outlets;
a control valve in line with each channel of the plurality of channels;
a bypass pipe extending from each channel of the plurality of channels that diverts a small portion of a flow from that channel and then returns the small portion of the flow back to that channel;
a thermal mass flow meter coupled to each of the bypass pipes, the thermal mass flow meter including a first temperature sensor, a second temperature sensor, and a heating element disposed between the first temperature sensor and the second temperature sensor, wherein the heating element is configured to heat the flow through the bypass pipe to a predetermined temperature of about 40 degrees to about 60 degrees Celsius; and
a controller to determine a flow rate through each of the plurality of channels based on a measured temperature difference between the first temperature sensor and the second temperature sensor and to control the control valve of each channel to provide a predetermined flow ratio of a process gas between the plurality of channels.

2. The flow ratio controller of claim 1, wherein the first temperature sensor and the second temperature sensor are disposed substantially equidistant from the heating element.

3. The flow ratio controller of claim 1, wherein the plurality of channels comprises three channels.

4. The flow ratio controller of claim 1, wherein the process gas includes at least one of hydrogen bromine (HBr), chlorine ($Cl_2$), nitrogen trifluoride ($NF_3$), tetrafluoromethane ($CF_4$), or silicon tetrachloride ($SiCl_4$).

5. The flow ratio controller of claim 1, wherein the control valve is disposed downstream of the bypass pipe.

6. The flow ratio controller of claim 1, wherein the first temperature sensor and the second temperature sensor are resistance temperature detectors.

7. The flow ratio controller of claim 1, wherein the heating element is external to the bypass pipe.

8. An apparatus for controlling gas distribution to an etch chamber, comprising:
a gas source;
an etch chamber having a chamber body and a plurality of gas delivery zones;
at least one flow ratio controller, comprising:
an inlet coupled to the gas source;
a plurality of channels from the inlet to a corresponding plurality of outlets, wherein the plurality of outlets are fluidly coupled to respective gas delivery zones of the etch chamber;
a bypass pipe extending from each channel of the plurality of channels that diverts a small portion of a flow from that channel and then returns the small portion of the flow back to that channel;

a thermal mass flow meter coupled to the bypass pipe, the thermal mass flow meter including a first temperature sensor, a second temperature sensor, and a heating element disposed between the first temperature sensor and the second temperature sensor, wherein the heating element is configured to heat the flow through the bypass pipe to a predetermined temperature; and a controller to provide a flow ratio of a process gas from the gas source between the plurality of outlets and to determine a flow rate through each of the plurality of outlets based on a measured temperature difference between the first temperature sensor and the second temperature sensor, wherein the plurality of gas delivery zones comprises three gas delivery zones and the plurality of outlets comprises three outlets, wherein a first outlet is fluidly coupled to a first gas delivery zone via a first gas line, a second outlet is fluidly coupled to a second gas delivery zone via a second gas line, and a third outlet is fluidly coupled to a third gas delivery zone via a third gas line.

9. The apparatus of claim 8, wherein the process gas includes at least one of hydrogen bromine (HBr), chlorine ($Cl_2$), nitrogen trifluoride ($NF_3$), tetrafluoromethane ($CF_4$), or silicon tetrachloride ($SiCl_4$).

10. The apparatus of claim 8, wherein the at least one flow ratio controller comprises a first flow ratio controller and a second flow ratio controller, and wherein the gas source includes a first gas source having a first process gas coupled to the inlet of the first flow ratio controller and a second gas source having a second process gas coupled to the inlet of the second flow ratio controller, wherein the first gas source and the second gas source are separate.

11. The apparatus of claim 10, wherein the first process gas and the second process gas are mixed downstream from the first flow ratio controller and the second flow ratio controller and upstream from the etch chamber.

12. The apparatus of claim 8, wherein the predetermined temperature is about 40 degrees to about 60 degrees Celsius.

13. The apparatus of claim 8, wherein the third gas delivery zone is defined by a plurality of openings disposed about the chamber body through sidewalls of the chamber body.

14. A method of providing process gases to a process chamber, comprising:

flowing one or more process gases through a flow ratio controller to provide a first flow rate of the one or more process gases through a first channel to a first gas delivery zone in a process chamber, a second flow rate of the one or more process gases through a second channel to a second gas delivery zone in the process chamber, and a third flow rate of the one or more process gases through a third channel to a third gas delivery zone in the process chamber;

diverting a small flow from each of the first, second, and third channels to a respective thermal mass flow meter having a heating element, a first temperature sensor disposed upstream of the heating element, and a second temperature sensor disposed downstream of the heating element;

providing power to the heating element in each thermal mass flow meter to heat the heating element to a predetermined temperature that prevents corrosion of the one or more process gases; and using a controller to calculate a measured temperature difference between the first temperature sensor and the second temperature sensor of each thermal mass flow meter to determine the first flow rate, the second flow rate, and the third flow rate; and at least one of:

further comprising using the controller to control a control valve in line with each respective channel to provide a desired quantity of process gas to each respective outlet of the flow ratio controller, or wherein flowing one or more process gases to the third pas delivery zone comprises flowing the one or more process gases through sidewalls of the process chamber.

15. The method of claim 14, wherein the one or more process gases comprises at least one of hydrogen bromine (HBr), chlorine ($Cl_2$), nitrogen trifluoride ($NF_3$), tetrafluoromethane ($CF_4$), or silicon tetrachloride ($SiCl_4$).

16. The method of claim 14, wherein providing power to the heating element comprises heating the heating element to a predetermined temperature of about 40 degrees to about 60 degrees Celsius.

17. The method of claim 14, wherein determining the first flow rate, the second flow rate, and the third flow rate comprises using a Wheatstone bridge circuit to convert the measured temperature difference into a voltage difference that is calibrated against known flow rates.

* * * * *